METHOD OF MAKING PLURAL LAYER THIN FILM DEVICES

Filed June 28, 1960 2 Sheets-Sheet 1

INVENTOR
BRUCE I. BERTELSEN
BY Leo J. Aubel
ATTORNEY

Nov. 12, 1963 B. I. BERTELSEN 3,110,620

METHOD OF MAKING PLURAL LAYER THIN FILM DEVICES

Filed June 28, 1960 2 Sheets-Sheet 2

3,110,620
Patented Nov. 12, 1963

3,110,620

METHOD OF MAKING PLURAL LAYER THIN FILM DEVICES

Bruce I. Bertelsen, Vestal, N.Y., assignor to International Business Machines Corporation, New York, N.Y., a corporation of New York Filed June 28, 1960, Ser. No. 39,262
2 Claims. (Cl. 117—217)

The present invention relates to thin films and, more particularly, to apparatus and methods for forming, by evaporization techniques, thin films comprising conductive and nonconductive materials on a suitable substrate such as glass.

For certain applications, it is advantageous to form thin films as conductive lines and utilize the lines as the drive wiring for memory matrices; and, for such applications, lines which have relatively low resistances are desirable. In such applications, the thin films comprise alternate layers of conductive and nonconductive or insulative materials, and the insulation must be sufficient to provide relatively high resistance between two adjacent conductive layers.

Accordingly, it is a principal object of this invention to provide an improved method of depositing a thin film on a substrate, which film comprises alternate layers of conductive and nonconductive materials and which film provides good insulation between adjacent conductive layers.

It has been found that the metals having the best conductive properties such as gold, silver and copper do not suitably bond, that is, adhere to substrate materials such as glass or ceramic nor to other types of nonconductive materials; and, in general, the adhesion of the aforementioned metals to the substrates and the nonconductive materials becomes less as the thickness of the deposited layer of metal increases.

Accordingly, it is yet another object of this invention to provide an improved method for vacuum deposition of a thin film comprising a conductive material having good bonding or adhesion to substrates and to nonconductive materials. Good bonding or adhesion prevents the various layers from separating one from the other and from the substrate.

In one form, the invention provides an improved method of vacuum deposition of a thin coating or film, which film comprises alternate layers of conductive materials such as gold, silver or copper and nonconductive materials, such as silicon monoxide, with a layer of a material having good bonding properties, such as aluminum, interposed between the various layers. A suitable vacuum developing apparatus having separate compartments, suitable heating apparatus, and suitable masking apparatus are utilized.

A crucible which contains a nonconductive material such as silicon monoxide placed between a lower and an upper bed or thickness of conductive material having a high vaporization point such as tungsten rods or granules is placed in a first compartment. The material having a high vaporization point is inductively heated by radio frequency energy and transfers heat by radiation to vaporize the nonconductive material and also functions as a filter which limits the size of the particles of nonconductive material which passes to the substrate. A source of bonding material such as aluminum is located adjacent or within the crucible.

A melt containing a conductive material, say gold, is positioned in a second compartment.

The substrate is initially positioned in the first compartment and the bonding material is vaporized and an initial layer is deposited on the substrate. The substrate is then moved to the second compartment and a layer of conductive material in the form of conductive lines is evaporated on the bonding material. Next, the substrate is moved back to the first compartment and the temperature slowly increased. As the temperature rises, the bonding material is caused to evaporate first and provides a layer of bonding material on the previously deposited conductive material; the nonconductive material evaporates next and deposits a layer of nonconductive material on the layer of bonding material. The temperature is next lowered and a layer of bonding material is next deposited on the nonconductive material; the substrate is then moved to the second compartment and a layer of conductive material in the form of conductive lines deposited thereon.

The process is repeated until the desired number of layers are deposited on the substrate.

The foregoing and other objects, features and advantages of the invention will be apparent from the following more particular description of preferred embodiments of the invention, as illustrated in the accompanying drawings.

Figure 1:
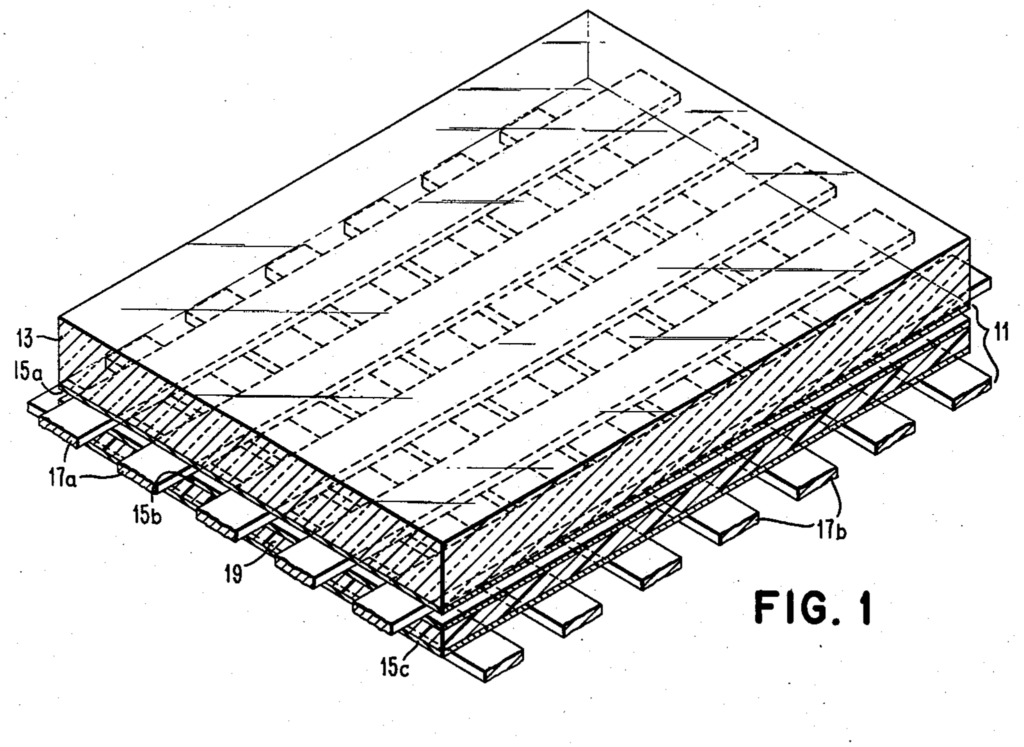
FIG. 1 is an isometric view of a thin film formed according to the invention.
Figure 2:
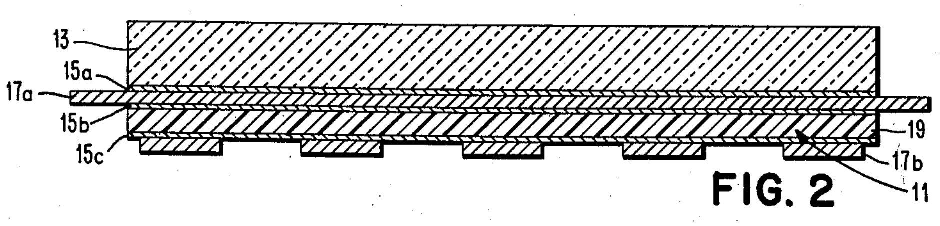
FIG. 2 is a elevational view of the structure of FIG. 1.

Referring to the drawings, FIG. 1 shows a coating or film formed in accordance with the invention. The structure of the film 11 is readily appreciated from the figure and comprises the various layers formed on a surface or substrate 13, in this case glass. The film 11 comprises a layer 15*a* of aluminum which has been evaporated on the substrate 13, a first layer of conductive lines 17*a* of gold formed over the layer 15*a* of aluminum, and a second layer 15*b* of aluminum formed over the layer 17*a* of gold. Next, a layer 19 of silicon monoxide is formed on the second layer 15*b* of aluminum, a third layer 15*c* of aluminum formed on the layer 19 of silicon monoxide, and a second layer of conductive lines 17*b* of gold is formed on the third layer 15*c* of aluminum. The layer of silicon monoxide is approximately twice as thick as the conductive lines of gold, while the layers of aluminum are relatively thin with respect to the layers of gold, that is, about 1000 angstroms in thickness. Although in this embodiment only two distinct layers of conductive material and one layer of nonconductive material are employed, it will be apparent that any number of such layers could be employed. As will be appreciated, suitable masking of any well-known type is employed to obtain conductive lines 17*a* arranged parallel to one another. To obtain lines 17*b* perpendicular to lines 17*a* the mask is either reoriented or the masks are changed.

It has been found that aluminum bonds or adheres well to substrate material such as ceramic or glass, to gold, silver, copper, and to dielectric or nonconductive materials such as silicon monoxide. Gold, silver and copper which are better conductors than aluminum do not have as good adhesion to substrate materials as does aluminum. Also, the adhesive properties of gold, silver, copper and silicon monoxide decrease as the thickness of the deposited layer increases. In accordance with the invention, a layer of aluminum is deposited between each two layers of dissimilar materials to provide good adhesion therebetween. Chromium also bonds well to ceramic or glass and has a low conductivity so that it may be used instead of aluminum. However, chromium vaporizes at a relatively high temperature and can therefore not be conveniently used where fractional distillation is to be performed as described hereinbelow.

Heretofore, it has not been possible to practically and conveniently overcome the problems of pinholes in an evaporating insulator. As is known, dust particles in the film cause loss of insulation and it is not conveniently possible to maintain a 100 percent dust free surface on which to deposit a thin film. Dust particles prevent straight-line deposition from creating a continuous film on the surface of the substrate or on the surface of the metals and of the silicon monoxide. Subsequent evaporation of a metal can either move the particle, render the particle conductive, that is, carbonize it, or approach the surface at a new angle to result in a short circuit to the insulating layer. Thus, vacuum deposited thin films have heretofore not provided satisfactory insulation between adjacent layers.

As mentioned above, thin films are employed as drive wiring, that is, conductive lines, and in such cases the lines may be arranged to cross each other within a $\frac{1}{16}$ inch area. The insulation between the conductive lines formed on adjacent conductive layers should have a resistance of 1000 ohms or greater therebetween. Heretofore, the only evaporable materials which have been found to result in insulation having the above properties were the low melting glasses; that is, glass mixtures of arsenic, sulphur, thallium or selenium. However, the foregoing glasses cause serious problems; first, destructive chemical reactions with copper or silver; secondly, loss of insulation when excessive heating occurred during deposition of thick conductive layers; and third, loss of insulation when heavy, energetic particles struck the film.

In accordance with one form of the invention, silicon monoxide is vacuum deposited on aluminum and an aluminum layer is then overlaid or deposited on the silicon monoxide to provide insulation of adjacent conductive layers of gold or the other conductive materials. In one particular embodiment, 160 lines formed on one layer were arranged perpendicular to lines formed on an adjacent layer. Lines on the adjacent layers which crossed each other within a $\frac{1}{16}$ inch area were insulated in the foregoing manner with a layer of silicon monoxide varying in thickness from 1000 angstroms to 3 microns. There was found to be over two megohms resistance between the lines of adjacent layers.

The reasons for the development of such a good insulation by this process is not fully known. However, a number of aluminum silicates are known to exist in nature and the vapor pressure of these compounds is very likely to vary over a wide range. This can lead to migrant silicates on the surface which can give up their energy by taking on an additional attachment to another aluminum atom when one is encountered.

Figure 4:
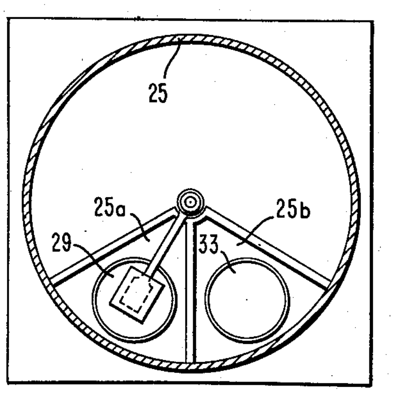
FIG. 4 is a plan view, partly in section, of the apparatus of FIG. 3.
Figure 3:
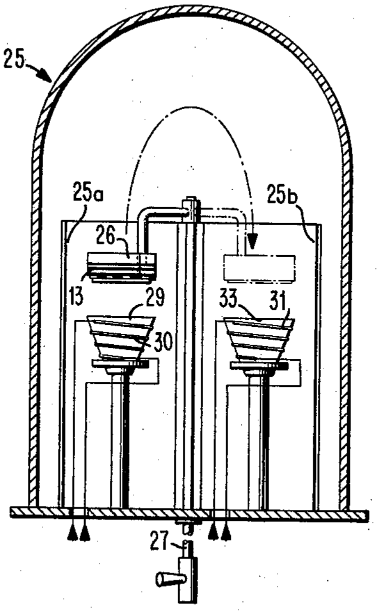
FIG. 3 is an elevational view, partly in section, of a vacuum apparatus utilized in practicing the method of forming a thin film in accordance with the invention.

Referring now to FIGS. 3 and 4, the deposition of the thin film is performed within a vacuum chamber 25 of any suitable, well-known type. The vacuum chamber includes at least two separate compartments 25*a* and 25*b* which are closed from one another to prevent material particles from passing from one to the other of the compartments. The substrate 13 to be coated is mounted as by a clamp 26 affixed by an inverted L-shaped rod 27 centrally positioned within chamber 25. Mechanical or manual means are provided for lifting and turning rod 27 such that the clamp 26 holding the substrate 13 is movable from one to the other compartment as indicated by the dot-dashed lines. As noted above, masking means of any suitable known type, not shown, are provided for forming conductive lines arranged as desired.

A crucible 29 of refractory metal such as aluminum trioxide is placed in compartment 25*a* and heated as by a source of energy, not shown, through coil 30 which is circumposed on the crucible 29. The source for heating the crucible may be similar to that shown in FIG. 5. For purposes, to be explained below, crucible 29 may contain a melt of gold or a melt of gold and aluminum.

Figures 5, 6:
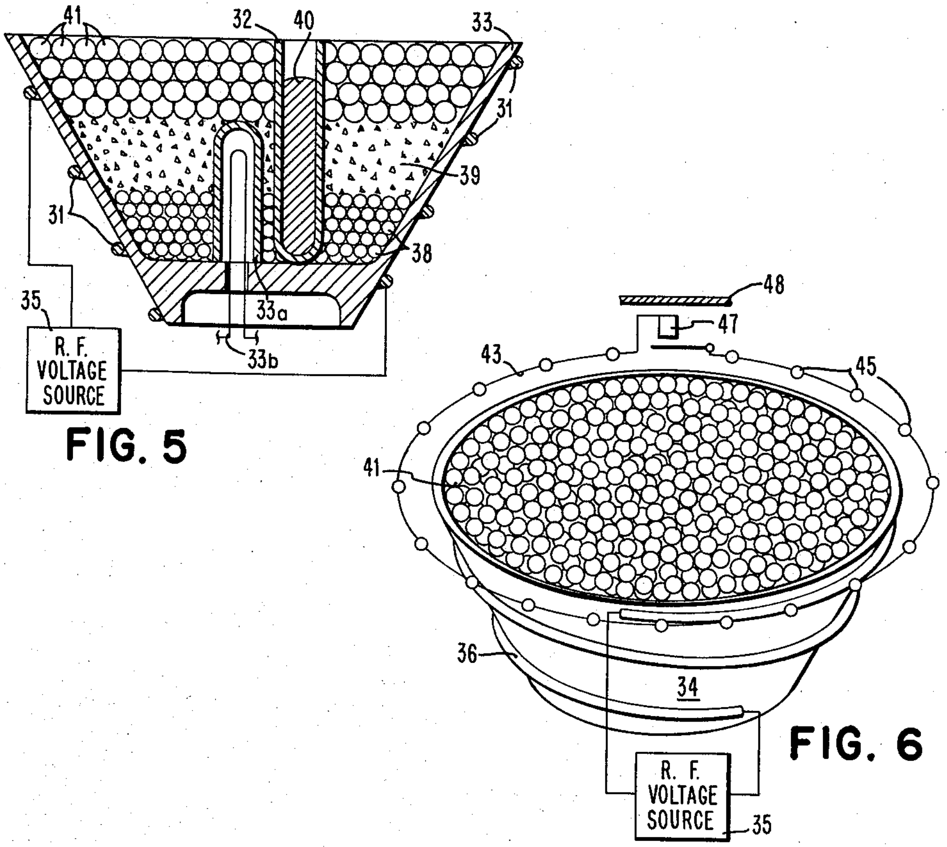
FIG. 5 is an enlarged cross-sectional view of a crucible shown in FIG. 3.
FIG. 6 is an isometric view of a modification of the crucible and heating arrangement of FIG. 5.

Referring now also to FIG. 5, a second crucible 33 of similar material as crucible 29 and containing silicon monoxide and tungsten is placed in compartment 25*b* and inductively heated as by a source 35 of radio frequency energy through coil 31 which is circumposed on the crucible 33. Source 35 may be of any suitable, well-known type. A beryllium oxide thimble 32 containing aluminum 40 is placed within crucible 29. The opening of thimble 32 extends upward so that tungsten particles do not cover the aluminum. A thermocouple 33*b* is placed in a holder 33*a* within crucible 33 for measuring the temperature of the material in the crucible 33.

Crucible 33 is filled as follows: a bed or thickness of short pieces of tungsten rods or tungsten granules 38 are placed at the bottom of the crucible. A bed or thickness of a mixture of dielectric or nonconductive material such as silicon monoxide 39 in powdered or granule form is placed over the tungsten rods 38; next, a bed or thickness of pieces of tungsten rods or relatively large granules 41 are placed over the silicon monoxide 39. The bed of tungsten rods 38 might be dispensed with, however, by sandwiching the nonconductive material between the conductive material a more efficient heat transfer is obtained.

If a melt of gold and aluminum is placed in crucible 29, the method of evaporating the film 11 on the substrate 13 is as follows. The substrate to be coated is initially positioned in compartment 25*a*. Aluminum has a higher vapor pressure than gold, that is, it evaporates at a lower temperature than gold and fractional distillation or evaporation may be employed. Radio frequency energy may be employed to heat the crucible 29 to about 800° C., the evaporation temperature of aluminum. Starting from 800° C., energy is applied to slowly raise the temperature to provide fractional distillation of the melt and evaporate first the aluminum layer 15*a* and then lines 17*a* of gold onto the substrate 13. A temperature of about 1600°–1800° C. will evaporate the aluminum and gold in a proportion which is approximate that of the composition of the melt. The mass of gold in the melt is proportionally a larger amount than the mass of aluminum so that when the temperature is raised to 1600°–1800° C. a predominantly gold composition is evaporated onto the substrate 13.

The substrate 13 is next moved to compartment 25*b*. Radio frequency energy is then applied through coil 31 to crucible 33 causing heat to be generated in the tungsten pieces or particles 38 and 41; the heat generated in the tungsten pieces 38 and 41 is transferred by radiation and gaseous conduction to the silicon monoxide 39 and to the aluminum melt 40 in thimble 32.

The evaporation surface of the aluminum 40 is relatively small with respect to the evaporation surface of the silicon monoxide in order to control the relative amounts of aluminum and silicon monoxide deposited on the substrate. The aluminum has a higher vapor pressure than silicon monoxide so that initially the crucible 33 can be heated to 800°–1000° C. to evaporated a layer of aluminum 17*b* and then raised to 1300°–1500° C. for predominantly evaporating silicon monoxide. Obviously, at the higher temperature, aluminum will also be evaporated but since the evaporation area of the silicon monoxide is so much larger, relatively much more silicon monoxide than aluminum will be deposited on the substrate at this higher temperature.

The vaporized silicon monoxide rises and coats a layer 19 on the substrate 13. In case any solid particles of silicon monoxide 39 are driven upward, these particles encounter the many hot surfaces of the tungsten rods 38 before escaping the crucible 33. In this manner, only completely vaporized material leaves the crucible 33 to coat the substrate and solid particles are prevented from impinging on the substrate. The tungsten particles or rods 41 thus act as screens or filters.

Next, the substrate 13 is moved to compartment 25*a* and the operation of depositing aluminum and gold described above is repeated to form layer 15*c* and lines 17*b*, respectively.

If the melt placed in crucible 29 is gold only, then the substrate 13 is initially placed in compartment 25*b* and the temperature elevated to 800° C. to deposit a layer of aluminum 15*a* on the substrate 13. Next, the substrate 13 is moved to compartment 25*a* and the temperature in that compartment is elevated to the vaporization point of gold to cause a layer of gold 17*a* to be deposited on the initial layer of aluminum 15*a*. Then, the substrate is moved back to compartment 25*b* and a second layer of aluminum 15*b* is deposited on the layer of gold. The temperature in compartment 25*b* is then elevated to the vaporization temperature of silicon monoxide and a layer of silicon monoxide 21 is deposited on the aluminum layer 15*b*.

Finally, the temperature in compartment 25*b* is decreased to 800° C. and evaporation of silicon monoxide ceases but aluminum will continue to be evaporated to form aluminum layer 15*c* on substrate 13.

The process is repeated as desired.

FIGURE 6 shows a modification of the structure of FIG. 5 in which a different source of aluminum and a modified means of providing radio frequency energy to heat the aluminum are provided. In FIG. 6, a tungsten filament 43 in open circular form is circumposed on the crucible 34 in a position adjacent coil 36 which is also circumposed on crucible 34 and which is connected to radio frequency source 35 to provide energy for heating the crucible 34. Filament 43 has a number of aluminum staples 45 mounted in spaced relation on wire 43. A switch 47 comprising a mechanically movable piece of tungsten is actuable to connect the ends of filament 43 and thus provide a complete electrical loop. When filament 43 provides a complete loop, a current flowing in coil 36 will induce a current in filament 43 of sufficiently high amplitude to vaporize the aluminum staples 45 mounted on filament 43.

Aluminum is deposited on substrate 13 by closing the switch 47 to provide energy to vaporize the aluminum staples 45 until the aluminum layer is formed. By then opening the switch 47 and continuing to increase the radio frequency energy, the silicon monoxide 39 may be evaporated without contamination by the aluminum.

A shield 48 is positioned above switch 47 to prevent any tungsten which might vaporize from switch contacts from passing to the substrate.

As noted, by utilizing the invention and depositing lines formed on adjacent layers of conductive materials, and although the thickness of the silicon monoxide may vary from 1000 angstroms to 3 microns, the resistance between conductive lines on adjacent layers has been found to be in the megohm region.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of applying a thin film on a substrate by vaporization techniques comprising the steps of arranging said substrate at first and second positions to receive vaporized materials; positioning a melt of aluminum and gold to provide vaporized material to said substrate while said substrate is at its first position; placing a first thickness of pieces of tungsten into a container, placing a thickness of silicon monoxide on said first thickness of tungsten, and placing a thickness of pieces of tungsten on said silicon monoxide; positioning said container to provide vaporized material to said substrate while said substrate is at its second position; placing a source of aluminum to provide vaporized material while said substrate is at its second position; applying increasingly higher heat to fractionally vaporize said melt to initially deposit a first layer of aluminum and then a first layer of gold on said substrate, moving said substrate to said second position, applying increasingly higher heat to said melt of aluminum and to said container to fractionally vaporize said aluminum and then said silicon monoxide to thereby coat said first layer of gold with aluminum and next coat said aluminum with a layer of silicon monoxide, moving said substrate back to said first position, and applying a second layer of gold on said substrate whereby good adhesion of the various layers is obtained and whereby high insulation between the layers of gold is also obtained.

2. A method of applying a thin film on a substrate by vaporization techniques comprising the steps of arranging said substrate at first and second positions to receive vaporized material; positioning a melt of gold to provide vaporized material to said substrate when said substrate is at its first position; placing a first thickness of pieces of tungsten into a container, placing a thickness of silicon monoxide on said first thickness of tungsten, and placing a thickness of pieces of tungsten on said silicon monoxide; positioning said container to provide vaporized material to said substrate when said substrate is at its second position; positioning a source of aluminum to provide vaporized material to said substrate when said substrate is at its second position; positioning said substrate at its second position; vaporizing said aluminum to deposit a first layer of aluminum on said substrate; vaporizing said melt to deposit a first layer of gold on said substrate, moving said substrate to its second position, applying radio frequency energy to heat said source of aluminum and said container, said tungsten thickness being inductively heated by said radio frequency energy and transferring heat by radiation and gaseous conduction to vaporize said silicon monoxide, said tungsten prevening any solid particles of silicon monoxide from passing onto said substrate, said radio frequency energy being applied to provide increasingly higher heat to fractionally vaporize first said aluminum and then said silicon monoxide to coat said first layer of gold with aluminum and next coat said aluminum with a layer of silicon monoxide, moving said substrate back to said first position, and applying a second layer of gold on said substrate whereby good adhesion of the various layers is obtained and whereby high insulation between the layers of gold is also obtained.

References Cited in the file of this patent

UNITED STATES PATENTS

| | | |
|---|---|---|
| 2,584,660 | Bancroft | Feb. 5, 1952 |
| 2,724,663 | Bond | Nov. 22, 1955 |
| 2,740,928 | Ward | Apr. 3, 1956 |
| 2,783,164 | Hill | Feb. 26, 1957 |
| 2,842,463 | Bond et al. | July 8, 1958 |
| 2,852,416 | McNary et al. | Sept. 16, 1958 |

FOREIGN PATENTS

| | | |
|---|---|---|
| 201,592 | Australia | Apr. 20, 1956 |
| 722,866 | Great Britain | Feb. 2, 1955 |

OTHER REFERENCES

Holland, "Vacuum Deposition of Thin Films," 1956, John Wiley & Sons, New York, N.Y.; pages 485–487 relied on.